US006885584B2

United States Patent
Schillaci et al.

(10) Patent No.: US 6,885,584 B2
(45) Date of Patent: Apr. 26, 2005

(54) FAST PAGE PROGRAMMING ARCHITECTURE AND METHOD IN A NON-VOLATILE MEMORY DEVICE WITH AN SPI INTERFACE

(75) Inventors: Paolino Schillaci, Casteltermini (IT); Salvatore Poli, Mascalucia (IT); Antonio Giambartino, Palermo (IT); Antonino La Malfa, Milazzo (IT); Slavatore Polizzi, Palermo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/748,447

(22) Filed: Dec. 30, 2003

(65) Prior Publication Data

US 2005/0041471 A1 Feb. 24, 2005

(30) Foreign Application Priority Data

Dec. 30, 2002 (EP) .............................. 02425802

(51) Int. Cl.[7] .............................................. G11C 16/04
(52) U.S. Cl. .......................... 365/185.12; 365/185.07; 365/230.08
(58) Field of Search ..................... 365/185.12, 185.07, 365/230.08, 231, 235, 238.5, 230.03, 185.33

(56) References Cited

U.S. PATENT DOCUMENTS

| 4,638,463 A | * | 1/1987 | Rockett, Jr. ................. 365/205 |
| 4,943,962 A | | 7/1990 | Imamiya et al. ........ 365/230.08 |
| 6,483,901 B1 | | 11/2002 | Cuallo ...................... 379/88.28 |
| 6,775,184 B1 | * | 8/2004 | Park et al. ................ 385/185.08 |
| 2001/0021958 A1 | | 9/2001 | Zink et al. ................... 711/103 |
| 2002/0114211 A1 | | 8/2002 | Charlier et al. ............. 365/233 |
| 2004/0153902 A1 | * | 8/2004 | Machado et al. ........... 714/710 |

FOREIGN PATENT DOCUMENTS

EP 0 536 696 A2 4/1993

* cited by examiner

*Primary Examiner*—Richard Elms
*Assistant Examiner*—Dang Nguyen
(74) *Attorney, Agent, or Firm*—Lisa K. Jorgenson; Robert Iannucci; Seed IP Law Group PLLC (57) ABSTRACT

A circuit architecture and a method perform a page programming in non-volatile memory electronic devices equipped with a memory cell matrix and an SPI serial communication interface, as well as circuit portions associated to the cell matrix and responsible for the addressing, decoding, reading, writing and erasing of the memory cell content. Advantageously, a buffer memory bank is provided to store and output data during the page programming in the pseudo-serial mode through the interface. Data latching is performed one bit at a time and the following outputting occurs instead with at least two bytes at a time.

20 Claims, 8 Drawing Sheets

FAST PAGE PROGRAMMING ARCHITECTURE AND METHOD IN A NON-VOLATILE MEMORY DEVICE WITH AN SPI INTERFACE

FIELD OF THE INVENTION

The present invention relates to a fast page programming method in a non-volatile memory device with an SPI (serial peripheral interface) serial communication interface.

The invention relates also to an electronic memory device architecture for implementing the above-mentioned method and of the type comprising a memory cell matrix and an SPI serial communication interface, as well as circuit portions associated to the cell matrix and responsible for the addressing, decoding, reading, writing and erasing of the memory cell content.

More specifically, the invention relates to the hardware implementation of the address and data bus management to perform a fast page programming operation in a non-volatile EEPROM Flash memory equipped with an SPI serial protocol and the following description is made with reference to this specific field of application for convenience of illustration.

DESCRIPTION OF THE RELATED ART

As it is known to those skilled in the art, the non-volatile memory market is currently divided into four big categories:
  byte-programmable EEPROMs;
  page-programmable EEPROMs (where a page includes a plurality of bytes);
  byte-programmable FLASHes; and, page-programmable FLASHes.

Even though Flash memories are far simpler than EEPROM memories from a structural point of view, with some advantages in terms of occupied silicon area and costs, in Flash memories it is quite expensive to program several memory words at a time in terms of dissipated power.

Page programming has been provided in a Flash memory with an SPI communication interface to overcome this limit, and a SRAM memory has been provided inside the Flash memory to be used as a buffer for storing the words to be programmed in the matrix.

Supposing that a Flash memory matrix is divided into sectors comprising memory word pages with 8 bits per word, each word is identified in the less significant bits, A7-A0, of the address bit coding ranging from A23 to A0.

SRAM memory is addressed by using said less significant bits in order to have in this buffer register the image copy of the words of the pages which are in the matrix and which are addressed by the most significant bits, i.e., bits ranging from A23 to A8.

In such memories, page mode programming is generally performed by storing all words in the SRAM and by reading then the content thereof for each single word. If this content is different from "FF" (in a Flash memory, bits with logic value "1" indicate an erased cell), it will be stored in the corresponding word of the matrix sector page.

The operating mode of a flash memory with SPI serial communication protocol during the writing operation will be now briefly described.

In order to perform a writing operation in a Flash memory, independently from the protocol being used, it is necessary to remove first the protection against writing of the matrix sector to be programmed, by addressing a convenient protection register. Afterwards, it is necessary to give a writing command, which will be decoded by a specific unit in charge thereof (Command User Interface). This command serves to enable an internal programming algorithm and to pass then the matrix address and the datum or data to be programmed.

These three steps can be implemented according to the SPI protocol controlled by a state machine.

Figure 1:
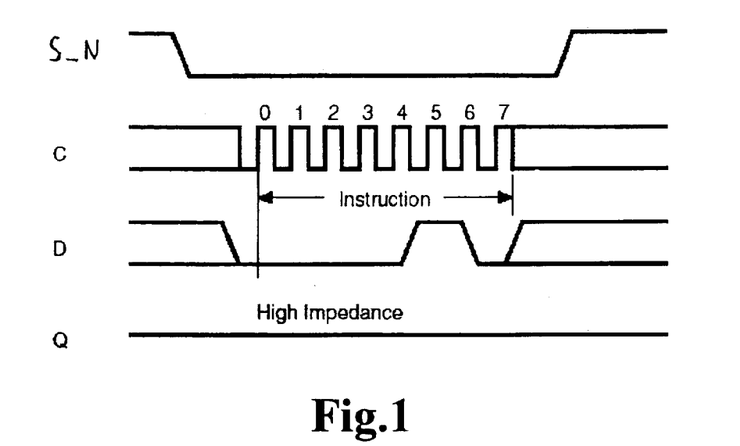
FIG. 1 shows on an equally-time-based diagram a sequence of signals to enable a known memory device for each type of writing.
Figure 2:
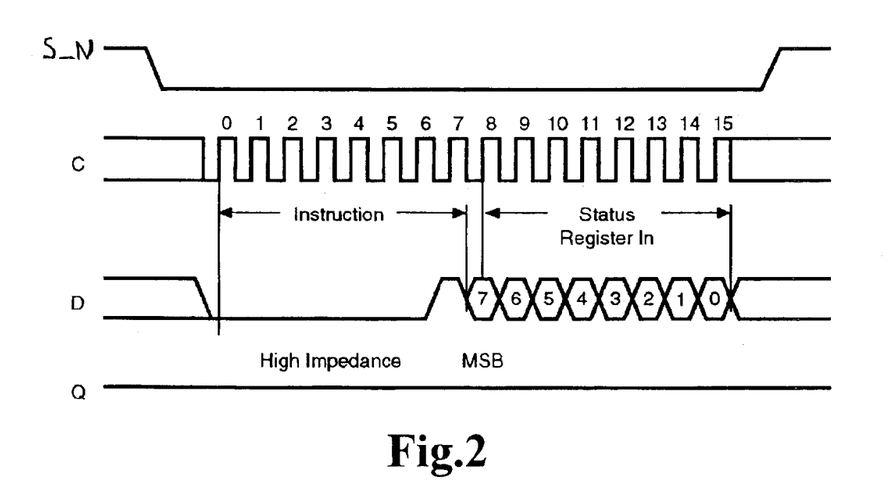
FIG. 2 shows on an equally-time-based diagram a sequence of signals to remove the protection of an addressed memory area to be programmed in the page mode in a known device.
Figure 3:
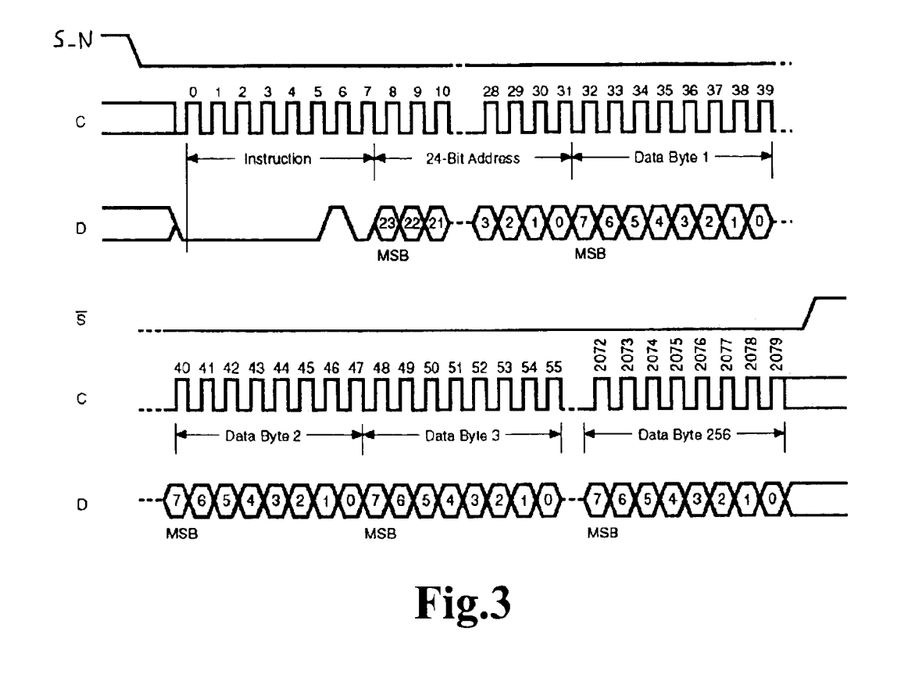
FIG. 3 shows on an equally-time-based diagram a sequence of signals to pass the Page Programming command, the address and the data to be programmed in a conventional memory device.

A page programming, always in the SPI mode, involves the execution of a convenient sequence of instructions:
  the first, referred to as WREN (Write Enable), serves to enable the memory device for all types of writing, as schematically shown in the signal sequence of FIG. 1;
  the second, referred to as WRSR (Write Status Register), allows the protection of the addressed memory area to be removed, as schematically shown in the signal sequence of FIG. 2;
  the third, referred to as PP (Page Program), allows the Page Programming command, the address and the data to be programmed to be passed, as schematically shown in the signal sequence of FIG. 3.

In FIGS. 1, 2 and 3 the signal S_N is the Chip Select, on whose falling edge the memory device is turned on, i.e., all input buffers are enabled.

Signal C is instead the timing or Clock signal, allowing the various steps of the SPI protocol to be synchronized.

Signal D is the input pin, through which instructions, addresses and data are passed; while signal Q is the output pin, through which read data are brought outwards.

Taking into account that a FLASH memory can program one byte at a time, to implement the page programming it is evidently necessary to store in a convenient structure the sequences of data to be programmed.

In particular, supposing that up to 256 bytes are to be programmed, the device has to be equipped with a volatile memory, like said SRAM, capable of storing up to 2048 bits.

Taking into account the high number of bits to be stored, the structure optimization is a decisive factor as far as the silicon area occupation is concerned.

As already mentioned, the simplest way for implementing the page programming is to use a buffer memory bank of the SRAM type (Static Random Access Memory). Obviously, such a memory bank is too complex for the task it has to perform. For example, it is not useful to have a random access to the memory, which involves the use of a row and column decoding circuitry, if in the end a following-address programming is performed on a FLASH memory.

BRIEF SUMMARY OF THE INVENTION

An embodiment of the present invention provides a memory device architecture and a corresponding fast page programming method, particularly for a non-volatile memory device equipped with an SPI serial communication interface, having such respective characteristics as to allow a buffer memory unit with low complexity and limited production cost to be used.

One embodiment of the present invention provides a buffer memory bank incorporated in the memory device and structured to store and draw data during the page programming in a pseudo-serial mode allowing data to be latched one bit at a time and at least two bytes to be then drawn at a time.

The features and advantages of the method and architecture according to the invention will be apparent from the following description of an embodiment thereof given by way of non-limiting example with reference to the attached drawings.

DETAILED DESCRIPTION OF THE INVENTION

An optimum structure to replace the SRAM buffer structure of the prior art would be the totally serial one, for example like the structure of a shift register, which would however suffer from excessive absorptions if several latch elements switched simultaneously. Moreover a shift register provides the use of a Flip-Flop Master-Slave and thus of a considerable number of transistors for each bit to be stored.

Figure 4:
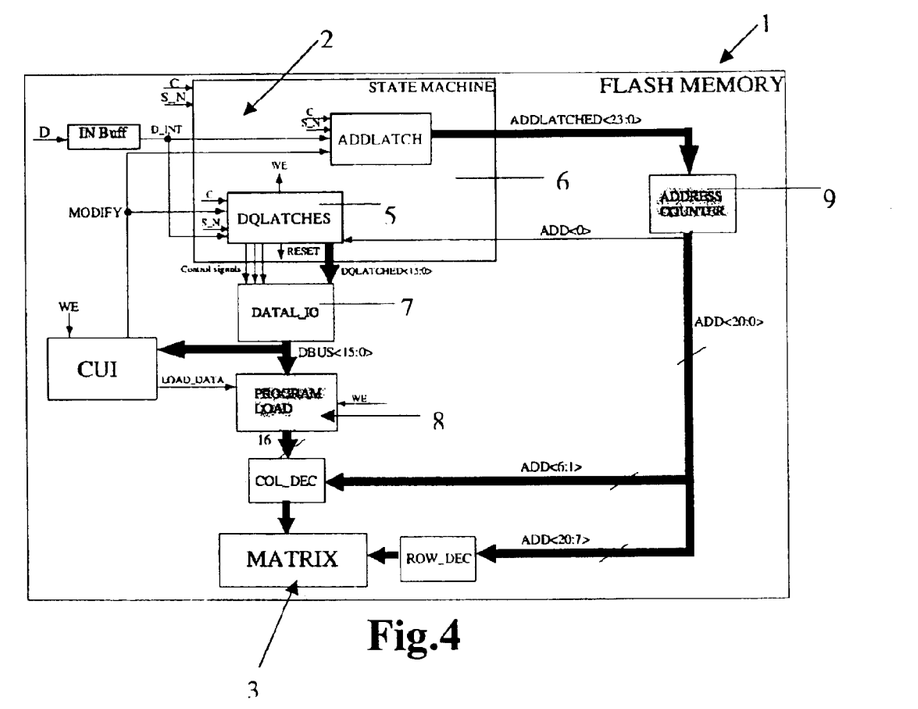
FIG. 4 is a schematic view of the architecture of a non-volatile memory electronic device according to one embodiment of the present invention.

With reference to the figures, and particularly to the example of FIG. 4, the architecture of a non-volatile, electronic memory device being monolithically integrated on a semiconductor and manufactured according to one embodiment of the present invention is globally and schematically indicated with 1.

The device 1 is arranged to allow a fast page programming and is equipped with an SPI serial communication interface 2.

Memory device means any monolithic electronic system incorporating a matrix 3 of memory cells, organized in rows and columns, as well as circuit portions associated to the cell matrix and responsible for the addressing, decoding, reading, writing and erasing of the memory cell content.

Such a device can be for example a semiconductor-integrated memory chip and of the non-volatile EEPROM Flash type divided in sectors and electrically erasable.

As is known, each memory cell comprises a floating gate transistor having source, drain and control gate terminals.

Among the circuit portions associated with the cell matrix, a row decoding circuit portion is provided which is associated with each sector and supplied with specific positive and negative voltages generated for example inside the integrated memory circuit by means of positive voltage boosters or charge pumps and regulated by means of corresponding voltage regulators.

The serial communication interface 2 supports an SPI serial operating mode for applications with a reduced number of pins. Page programming is implemented in different applications like microprocessors, audio cards, graphic cards, etc.

Advantageously, the device 1 incorporates a buffer memory bank 5 to be used during the page programming step.

If compared to known solutions, the memory bank 5 structure has been particularly simplified allowing the data storage therein and the following outputting to take place in a pseudo-serial mode.

Moreover, it is possible to overwrite stored data in the memory bank 5 for the following page programming steps without worrying about their reset. All this results in a saving by tens of thousands transistors normally necessary for the selection, erasing, etc.

The architecture of device 1 comprises a plurality of functional blocks which are used during the writing operation.

Figure 5:
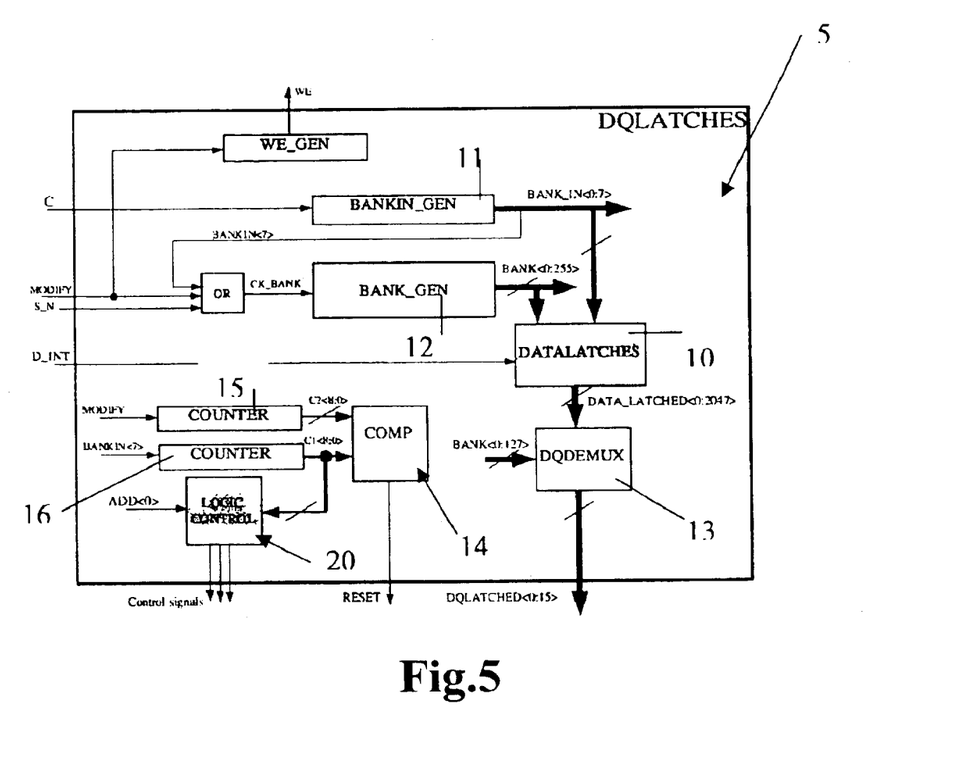
FIG. 5 is a schematic view of a detail of the device of FIG. 4.

FIG. 4 shows the block scheme of the circuits involved in the page programming operation, while FIG. 5 shows in greater detail the memory bank 5 DQLATCHES for storing and managing the data of the page to be programmed.

As it can be seen in FIG. 4, the architecture 1 provides a first input D, through which data, addresses and instructions are passed via an input buffer IN Buff to a state machine 6 representing the interface between the user and the memory device 1; a signal WE, generated by the block DQLATCHES; and a signal LOAD_DATA coming from a processing unit CUI (Command Users Interface).

The signal WE has the double function of synchronizing data, through the path going from the state machine 6 to the matrix 3, and from the state machine 6 to the CUI, while the signal LOAD_DATA has the function of loading data in the Program Loads 8 from which, afterwards, they will pass to the matrix 3, during the programming algorithm.

The data path during the programming operation from the input pin D to the matrix 3 and the blocks concerned will now be described in greater detail.

The Page Programming instruction provides that the Page Programming command, the address and, one after the other, all the bytes to be programmed pass through the input D.

The address, preferably a 24-bit-address, is stored in the block ADDLATCH of the state machine 6 wherefrom it is then transferred to the ADDRESS COUNTER 9 of the memory device 1. Data are instead stored in the buffer bank 5 DQLATCHES wherefrom they are then transferred in the Program Loads 8 of device 1.

The programming command, coming from the DBUS, is decoded by the unit CUI which enables the internal programming algorithm.

Once all data are temporarily stored in the buffer memory bank 5, on the rise front of the signal Chip Select (S_N) the first two bytes are loaded in the Program Loads 8, through the block 7 DATAL_IO managing the transfer of data from the DQLATCHED<15:0> to the internal bus DBUS<15:0> and the programming algorithm is started, providing the programming of said two bytes in the matrix 3.

At the end of the algorithm, on the falling edge of the signal MODIFY coming from the unit CUI, such signal being high during all the programming algorithm, the address stored in the ADDLATCH is increased. The increase is by two units since the two-bytes-at-a-time programming has been chosen.

At this point, a new signal LOAD_DATA is generated and the following two data latched in the bank 5 DQLATCHES are loaded in the Program Loads 8.

The signal MODIFY is also increased and the programming algorithm is started again. At the end of each algorithm the outputs of two counters 15, 16 (see FIG. 5), C1<8:0> and C2<8:0>, are compared.

When the programming of all latched bytes (C1=C2) ends, the memory bank DQLATCHES will provide a program-end signal, which will launch a reset of the state machine 6 and of the interface 2, as well as of the unit CUI.

FIG. 5 shows in greater detail the internal structure of the buffer memory bank 5 DQLATCHES.

Figure 6:
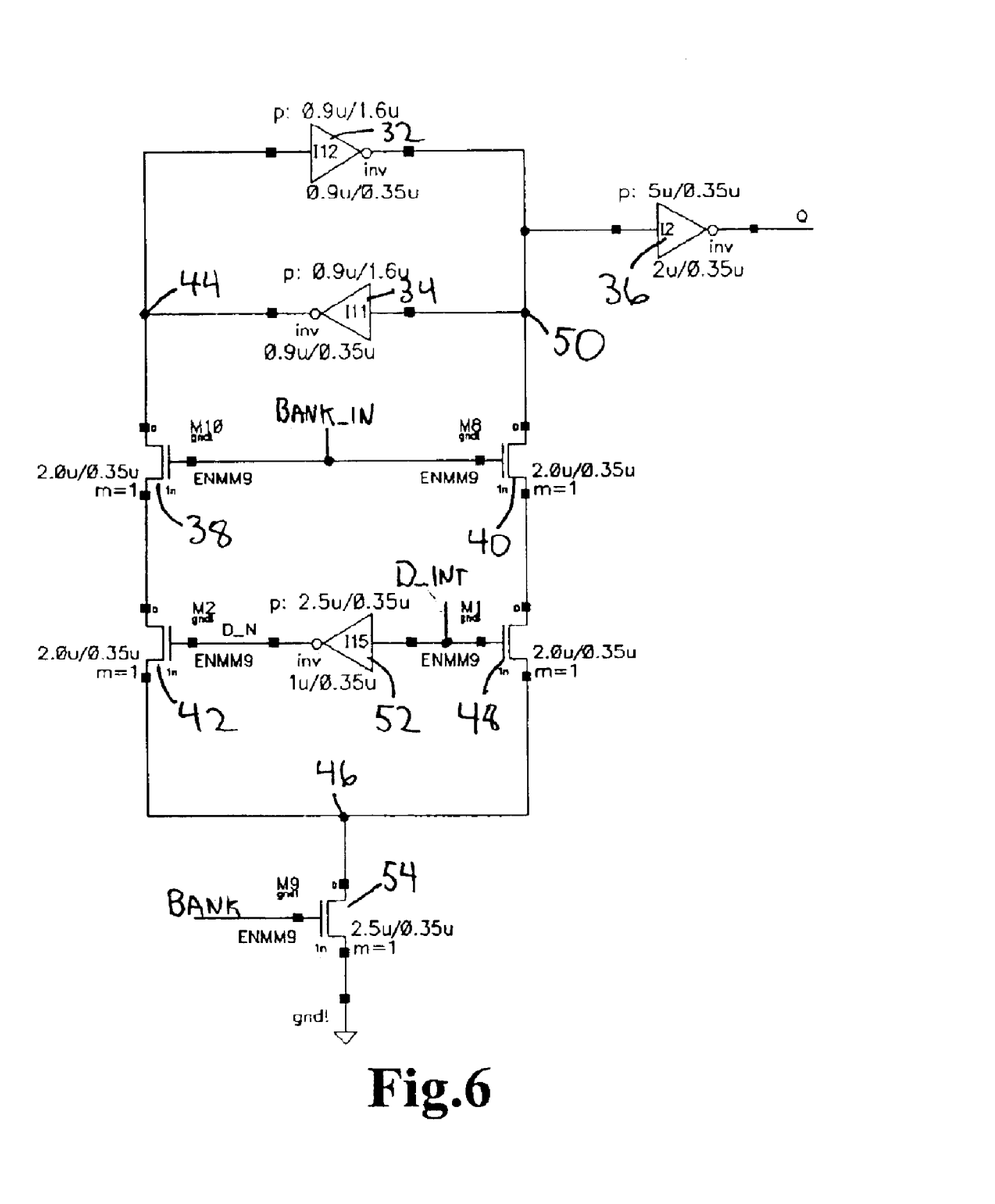
FIG. 6 is a schematic view of a circuit detail of a portion of the device of FIG. 4.

Some fundamental blocks can be identified: a block 10 DATALATCHES, comprising a battery of 2048 latches 30, like the ones schematically shown in FIG. 6, storing data to be programmed; the blocks 11, 12, 13 referred to as BANKIN_GEN, BANK_GEN and DQDEMUX, allow data to be latched one bit at a time and output two bytes at a time. The BANKIN_GEN block 11 and the BANK_GEN block 12 respectively generate an 8-bit BANK_IN address signal and a 256-bit address signal that together selectively enable the 2048 latches 30 of the DATALATCHES block 10. The DQDEMUX block 13 is a multiplexer that selectively outputs two bytes at a time from the DATALATCHES block 10 under the control of bits <0:127> of the BANK address signal.

There are also: two COUNTER blocks 15, 16 respectively storing the number of bytes to be programmed (C1) and the number of bytes already programmed (C2) in the matrix 3 at a precise moment of the Page Programming operation; a comparator block 14 COMP, susceptible of generating a reset pulse when the number of programmed bytes (C2) is equal to the number of bytes to be programmed (C1); and a control logic 20 LOGIC CONTROL.

This logic structure 20 takes into account the even or odd number of bytes to be programmed and the starting address and it provides convenient control signals to the block 7 DATAL_IO of FIG. 4 for the correct data loading in the Program Loads 8.

The structure chosen for the single bit latches 30 of the DATALATCHES bank 10 is that of a simple latch with two enabling signals: BANK_IN and BANK, and a data input (D_INT). FIG. 6 schematically shows a device circuit portion allowing a very compact layout and a considerable silicon area saving to be obtained, because of the simplicity thereof.

The latch 30 of FIG. 6 includes a typical latch structure of cross-coupled inverters 32, 34 that are connected to an input of an output inverter 36 having an output that provides an output Q of the latch 30. The latch also includes first and second NMOS transistors 38, 40 having respective gates connected together and driven by a bit of the BANK_IN signal. The first NMOS transistor 38 is connected in series with a third NMOS transistor 42 between first and second intermediate nodes 44, 46. Similarly, the second NMOS transistor 40 is connected in series with a fourth NMOS transistor 48 between the second intermediate node 46 and a third intermediate node 50. A gate of the fourth NMOS transistor 48 is connected to the data input D_INT and to an input of an inverter 52 having an output connected to a gate of the third NMOS transistor 42. A fifth NMOS transistor 54 is connected between the second intermediate node 46 and ground and has a gate connected to one bit of the BANK signal.

When the respective bits of the BANK_IN and BANK signals that are input to the latch 30 are logic one, the output Q of the latch is determined by the value of the data input $D_{13}$ INT. If D_INT is logic zero, then the inverter 52 turns on the third NMOS transistor 42 while the logic ones of the BANK_IN and BANK signals respectively turn on the first and fifth NMOS transistors 38, 54. This connects to ground the input of the first inverter 32, which drives the first inverter's output to logic one and causes the output inverter 36 to drive the output Q to a logic zero. Conversely, if D_INT is logic one, then the fourth NMOS transistor 48 is turned on, thereby connecting the third intermediate node to ground. This causes the output inverter 36 to drive the output Q to a logic one. If either of the incoming bits of the BANK_IN and BANK signals is logic zero, then the output Q of the latch 30 remains unchanged.

Figure 7:
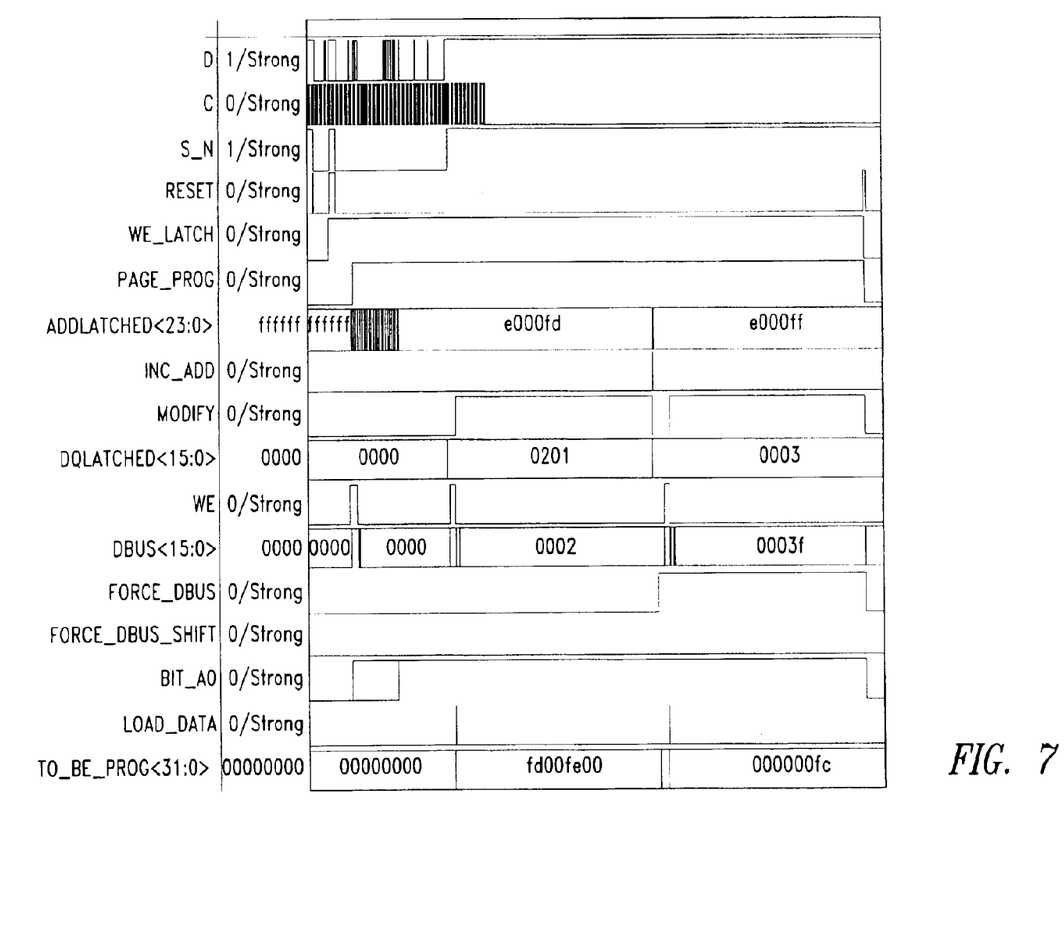
FIGS. 7 and 8 show on respective equally-time-based diagrams a set of significant signals of a fast Page Programming simulation in the memory device according to the invention.
Figure 8:
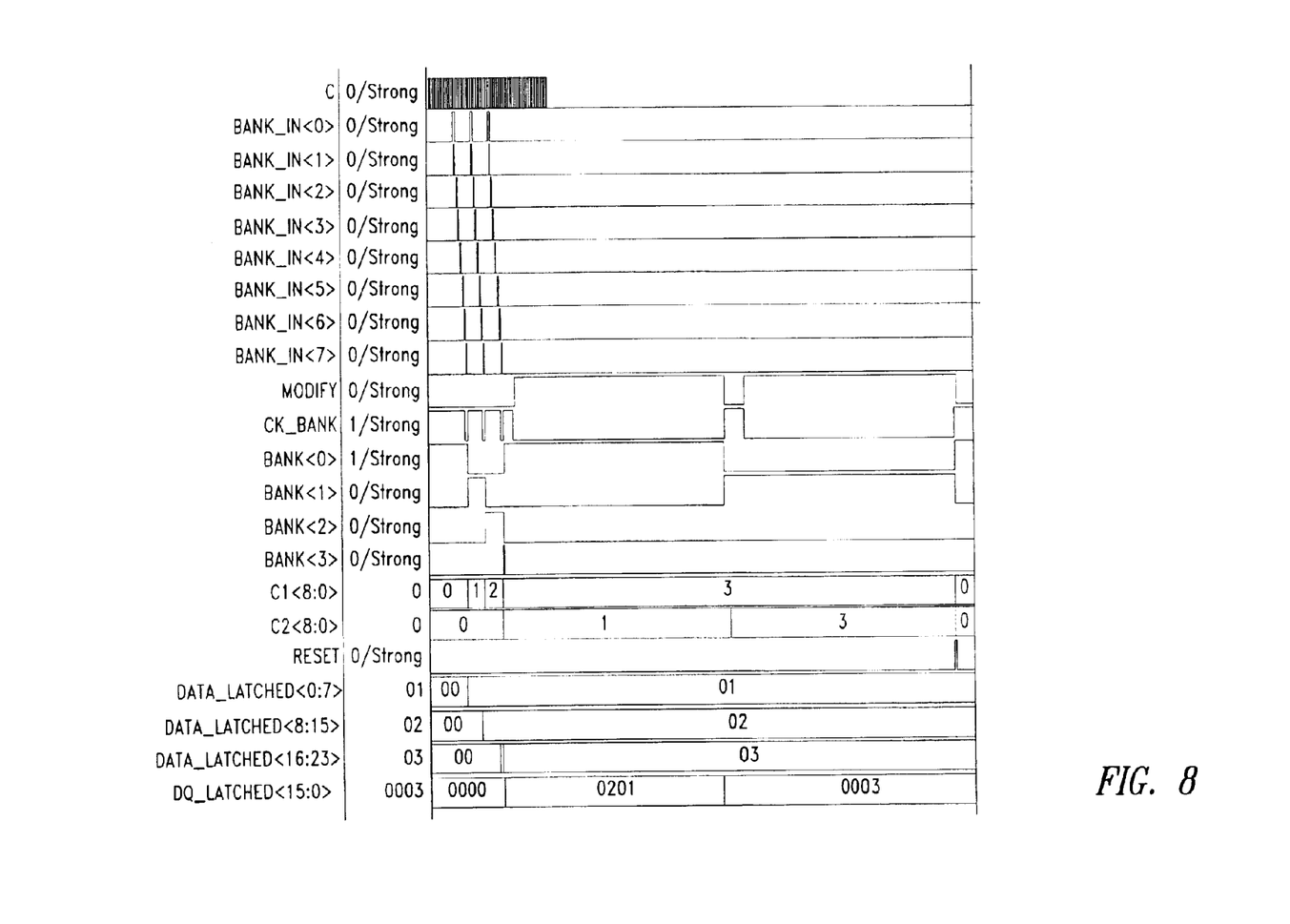

To fully understand the operation of the previously shown blocks, reference can be made to the examples of FIGS. 7 and 8 illustrating the signal evolution in a Page Programming simulation carried out at 50 MHz. Three bytes are supposed to be programmed.

In FIG. 7 it can be noted that further to the instruction WREN the signal WE_LATCH, enabling the memory 3 to all kinds of writing, is driven high.

At this point, passing the instruction PP, a pulse WE is generated, allowing the command on DBUS to be decoded by the unit CUI, and, consequently, the signal PAGE_PROG to be increased.

This signal PAGE_PROG will enable the whole logic being previously described with reference to FIGS. 4 and 5.

The following steps are of passing the 24 bits of the address ADDLATCHED<23:0>, which is stored in the ADDLATCH block, and of passing data to be programmed DATALATCHED<0:2047> which are stored in the DATALATCHES bank 10, as in FIG. 8.

It can be supposed that the memory structure used is divided into 256 sub-banks of eight latches each.

Each sub-bank is enabled by one of the signals BANK<0:255>, while the single latches are enabled by one of the signals BANK_IN<0:7>.

Therefore, in order to store the n-th byte the signal BANK<n−1> and, one after the other, the signals BANK_IN<0:7> must be increased.

Figure 9:
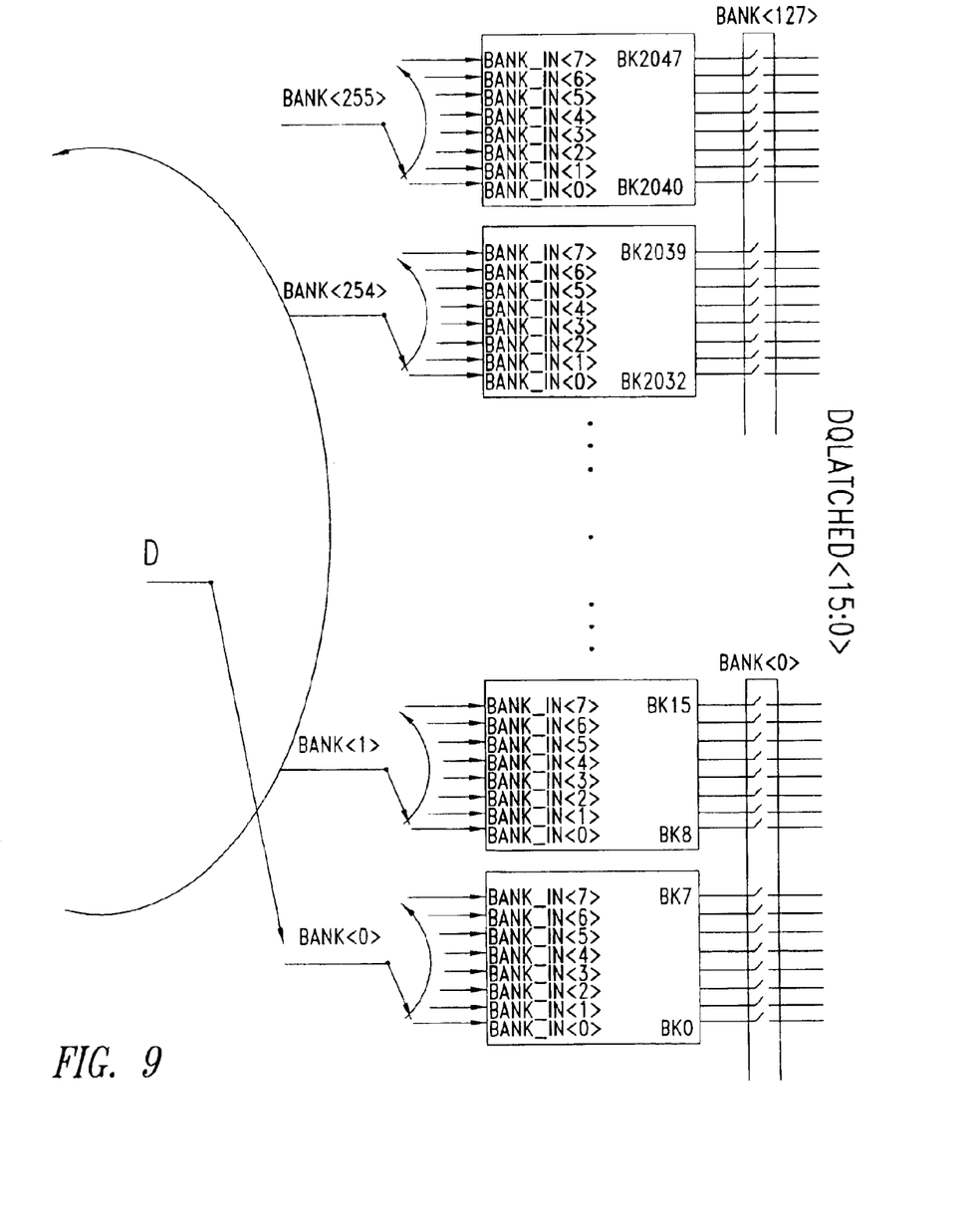
FIG. 9 is a schematic view showing the data latching mode one bit at a time and a following drawing two bytes at a time (sixteen bits) in the device according to the invention.

In substance, it is as if there was a double multiplexing of the bytes and of the bits inside the bytes. This situation is schematized in FIG. 9.

Once all bytes are latched, on the rise front of S_N the first two bytes are loaded in the DQLATCHED<15:0>, a signal WE rises, allowing data to pass on DBUS<15:0>, while the following signal LOAD_DATA loads these data in the Program Loads 8. It must be noted that the counter C1<8:0> comprises the number of bytes to be programmed.

The control signals FORCE_DBUS, FORCE_DBUS_SHIFT and BIT_AO manage the correct data load on the bus DBUS and therefrom in the Program Loads (TO_BE_PROG<31:0>). It must be noted that the Program Loads store the negative values of the data to be programmed.

At this point the real programming algorithm is started, i.e., the signal MODIFY is increased.

Since the number of bytes to be programmed is odd, the counter C2<8:0> initially indicates 1(h). In fact, if it was even, the starting value of C2 would be 2(h).

At the end of the algorithm, i.e., once the first two bytes are programmed, on the fall front of MODIFY, being C1 and C2 different, the latter is increased by two, indicating 3(h), or 4(h) if even.

On the same fall front a pulse (INC_ADD) rises, increasing the address by two units. Moreover a new WE rises, loading the third byte on DBUS and therefrom, through the signal LOAD_DTA, in the Program Loads 8.

The signal MODIFY rises again, i.e., the programming algorithm is started for the second time.

At the end of this programming step, being the third and last byte C1=C2=3(h), a reset signal rises, resetting the state machine 6.

The clock managing the generation of the signals BANK<0:255>, CK_BANK, is equal, during the byte latching step in the DTALATCHED, to the signal BANK_IN<7>, allowing the last bit of each byte to be latched, and during this step each BANK identifies a byte to be latched, while during the real programming step it is equal to the signal MODIFY, and during this step each BANK identifies two bytes to be programmed.

For example, the BANK<0> identifies in the first step the byte 0 to be latched, while in the second step it identifies the latched bytes 0 and 1 to be programmed.

Therefore, in the real programming step, the BANKs are 128 (BANK<0:127>), and whenever a BANK is increased, two new bytes, latched in the block DQLATCHES, are loaded on the DQLATCHED<15:0> and therefrom in the Program Loads 8.

The architecture and the method described above solve problems of the prior art and they achieve some advantages being described hereafter.

First of all, a logic structure has been provided, allowing the data input to be combined with the internal sixteen-bit bus.

The method used to perform the page programming and the circuit solution used to implement the page programming are innovative.

The logic used, together with the use of a very simple one-bit latch, allows the memory device circuit layout to be extremely compact. This obviously involves considerable advantages in terms of occupied silicon area and, consequently, of costs.

Moreover, the architecture suggested, besides allowing to operate at high frequencies (up to 50 MHz), provides the possibility to program two bytes at a time, halving the overall programming time. Moreover, by simply adding an external pin with Vpp=12V (Program Supply Voltage), four bytes at a time could be easily programmed, further reducing said time.

All of the above U.S. patents, U.S. patent application publications, U.S. patent applications, foreign patents, foreign patent applications and nonpatent publications referred to in this specification and/or listed in the Application Data Sheet are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A fast page programming architecture of a non-volatile memory electronic device, comprising:
   a memory cell matrix;
   an SPI serial communication interface;
   circuit portions associated with the cell matrix and responsible for addressing, decoding, reading, writing and erasing of the memory cell matrix; and
   a buffer memory bank for storing and outputting data during page programming in a pseudo-serial mode, wherein said buffer memory bank comprises a plurality of latches storing data to be programmed and memory blocks allowing data to be latched one bit at a time and output at least two bytes at a time.

2. An architecture according to claim 1, wherein said buffer memory bank is incorporated in a state machine receiving at an input data, addresses, and instructions to enter the memory cell matrix and the state machine produces a data synchronization signal that synchronizes transfer of data in a path going from the state machine to the memory cell matrix.

3. An architecture according to claim 1, wherein said buffer memory bank also comprises two counter blocks that respectively store a first number indicating how many bytes are to be programmed and a second number indicating how many bytes have already been programmed in the matrix at each precise moment of the page programming.

4. An architecture according to claim 1, further comprising a comparator block connected downstream to said counters and susceptible of generating a reset pulse when the first number is equal to the second number of bytes.

5. An architecture according to claim 1, further comprising a control logic to take into account whether an even or odd number of bytes is to be programmed and a starting address wherein the page programming is started, as well as to provide control signals to a block responsible for loading data in program loads that load data into the memory cell matrix.

6. An architecture according to claim 1, wherein each latch includes a data input, first and second control inputs, and an output, the latch being structured to change a logic value at the output based on a logic value at the input only when triggered by respective control signals at the first and second control inputs.

7. An architecture according to claim 6 wherein each latch includes:
   cross-coupled inverters positioned between first and second latch nodes, the second latch node being connected to the output;
   first and second switches connected in series between the first latch node and a third latch node;
   third and fourth switches connected in series between the second latch node and the third latch node, the first and third switches having respective control terminals connected together and to the first control input, and the second and fourth switches having respective control terminals connected together and to the data input; and
   a fifth switch connected between the third latch node and a reference voltage and having a control terminal connected to the second control input.

8. A method for performing a page programming in non-volatile memory electronic devices equipped with a memory cell matrix and an SPI serial communication interface, as well as circuit portions associated with the cell matrix and responsible for addressing, decoding, reading, writing, and erasing of the memory cell matrix, the method comprising:
   latching data in a buffer memory bank one bit at a time during the page programming through said interface; and
   outputting from the buffer memory bank at least a byte of data at a time during the page programming.

9. A method according to claim 8, wherein the outputting step outputs at least two bytes at a time from said buffer memory bank.

10. A method according to claim 8, further comprising providing a Page Programming instruction that includes a Page Programming command, a memory address and all bytes from the data one after another through an input of said interface.

11. A method according to claim 8, wherein the data contained in the memory bank are overwritten when a following page programming starts without performing a reset of the bank itself.

12. A method according to claim 8, further comprising calculating how many bytes of the data are to be programmed and how many bytes are already programmed in the matrix at each precise moment of the Page Programming operation.

13. A non-volatile memory device, comprising:
   a non-volatile memory cell matrix;
   a data input for receiving data to be programmed into the memory cell matrix;
   a buffer memory bank connected between the data input and the memory cell matrix and structured to buffer the data between the data input and the memory cell matrix during a page programming mode, wherein the buffer memory bank comprises a plurality of latches that respectively latch the data one bit at a time and output at least a byte at a time.

14. The memory device of claim 13, wherein the buffer memory bank is incorporated in a state machine receiving at an input data addresses, and instructions to enter the memory cell matrix and the state machine produces a data synchronization signal that synchronizes transfer of data in a path going from the state machine to the memory cell matrix.

15. The memory device of claim 13, wherein the buffer memory bank also comprises two counter blocks that respectively store a first number indicating how many bytes are to be programmed and a second number indicating how many bytes have already been programmed in the matrix at each precise moment of the page programming.

16. The memory device of claim 15, further comprising a comparator block connected downstream to the counters and structured to generate a reset pulse when the first number is equal to the second number of bytes.

17. The memory device of claim 13, wherein each latch includes a data input, first and second control inputs, and an output, the latch being structured to change a logic value at the output based on a logic value at the input only when triggered by respective control signals at the first and second control inputs.

18. The memory device of claim 13 wherein each latch includes a data input, first and second control inputs, and an output, the latch being structured to change a logic value at the output based on a logic value at the input only when triggered by respective control signals at the first and second control inputs.

19. The memory device of claim 18 wherein each latch includes:
   cross-coupled inverters positioned between first and second latch nodes, the second latch node being connected to the output;
   first and second switches connected in series between the first latch node and a third latch node;
   third and fourth switches connected in series between the second latch node and the third latch node, the first and third switches having respective control terminals connected together and to the first control input, and the second and fourth switches having respective control terminals connected together and to the data input; and
   a fifth switch connected between the third latch node and a reference voltage and having a control terminal connected to the second control input.

20. The memory device of claim 19 further comprising an inverter connected between the control terminals of the second and fourth switches.

* * * * *

UNITED STATES PATENT AND TRADEMARK OFFICE
CERTIFICATE OF CORRECTION

PATENT NO.     : 6,885,584 B2
DATED          : April 26, 2005
INVENTOR(S)    : Paolino Schillaci It is certified that error appears in the above-identified patent and that said Letters Patent is hereby corrected as shown below:

<u>Title page,</u>
Item [75], Inventors, "Slavatore Polizzi" should read -- Salvatore Polizzi --.

Signed and Sealed this

Thirtieth Day of August, 2005

JON W. DUDAS
*Director of the United States Patent and Trademark Office*